US012776785B2

(12) United States Patent
Savell et al.

(10) Patent No.: US 12,776,785 B2
(45) Date of Patent: Oct. 27, 2026

(54) SPARSITY STORAGE ARCHITECTURES FOR TRANSPOSABLE DATASETS

(71) Applicant: Microsoft Technology Licensing, LLC, Redmond, WA (US)

(72) Inventors: Thomas Craig Savell, Emeryville, CA (US); Spencer Ellis Williams, Raleigh, NC (US); Nitin Naresh Garegrat, San Jose, CA (US); Kyung-Nam Han, Oviedo, FL (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 27 days.

(21) Appl. No.: 18/757,173

(22) Filed: Jun. 27, 2024

(65) Prior Publication Data

US 2026/0005706 A1 Jan. 1, 2026

(51) Int. Cl.
*H03M 7/00* (2006.01)
*H03M 7/30* (2006.01)

(52) U.S. Cl.
CPC ....... *H03M 7/3066* (2013.01); *H03M 7/6005* (2013.01); *H03M 7/6011* (2013.01)

(58) Field of Classification Search
CPC .... G06N 3/063; G06N 3/0495; G06N 3/0464; G06N 3/045; G06N 3/048; G06N 3/08; G06N 3/04; G06N 3/082; G06N 3/084; G06N 20/00; G06N 3/0455; G06N 3/09; G06N 5/04; H03M 7/3059; H03M 7/3066; H03M 7/30; H03M 7/3077; H03M 7/3082; H03M 7/6005; G06T 1/20; G06T 15/005; G06T 1/60; G06T 11/00; G06T 15/04; G06T 15/20; G06T 19/006; G06T 2200/04; G06T 2210/12; G06T 9/002
USPC .................................... 341/50, 51, 107, 106
See application file for complete search history.

(56) References Cited

U.S. PATENT DOCUMENTS 7,439,883 B1 * 10/2008 Moni .................. H04N 19/423 341/60
12,007,885 B2 * 6/2024 Avudaiyappan ...... G06F 12/023
2008/0126467 A1 * 5/2008 Ghuloum ................ G06F 17/16 708/520
2014/0188969 A1 * 7/2014 Chotai .................... G06F 17/16 708/520

(Continued)

OTHER PUBLICATIONS

Extended European search report received in European Application No. 25184197.9, mailed on Oct. 28, 2025, 08 pages.

*Primary Examiner* — Linh V Nguyen

(57) ABSTRACT

Techniques for manipulating sparsity storage architectures are provided. One aspect includes a computing device for implementing sparsity storage architectures, the computing device comprising processing circuitry and memory comprising instructions that, during execution, causes the processing circuitry to receive a dataset comprising data values; encode the received dataset by identifying a subset of the data values in the received dataset; and generating metadata describing indices of the subset of the data values in the received dataset; and store the encoded dataset comprising the metadata and packed data, wherein the packed data corresponds to the subset of the data values, and wherein the encoded dataset is capable of being decoded into a transposable data format with a same sparsity level in transposed and non-transposed forms.

20 Claims, 10 Drawing Sheets

(56) References Cited

U.S. PATENT DOCUMENTS

| | | | | |
|---|---|---|---|---|
| 2017/0293659 | A1* | 10/2017 | Huang | H03M 7/3066 |
| 2019/0188239 | A1* | 6/2019 | Serrano | G06F 9/3851 |
| 2019/0266217 | A1* | 8/2019 | Arakawa | G06F 7/462 |
| 2020/0342632 | A1* | 10/2020 | Frumkin | G06F 7/544 |
| 2022/0067524 | A1* | 3/2022 | Mathaikutty | G06N 3/04 |
| 2023/0186545 | A1* | 6/2023 | Schluessler | G06T 15/005<br>345/419 |
| 2024/0160695 | A1* | 5/2024 | Kondru | G06F 17/17 |
| 2025/0371331 | A1* | 12/2025 | Raha | G06N 3/063 |

* cited by examiner

FIG. 7
700
SB00 SB01 SB02 SB03 SB04 SB05 SB06 SB07
SB10 SB11 SB12 SB13 SB14 SB15 SB16 SB17
SB20 SB21 SB22 SB23 SB24 SB25 SB26 SB27
SB30 SB31 SB32 SB33 SB34 SB35 SB36 SB37
SB40 SB41 SB42 SB43 SB44 SB45 SB46 SB47
SB50 SB51 SB52 SB53 SB54 SB55 SB56 SB57
SB60 SB61 SB62 SB63 SB64 SB65 SB66 SB67
SB70 SB71 SB72 SB73 SB74 SB75 SB76 SB77

800

50% SPARSITY DATA TILE WITH 64 4X4 MATRICES

| DATA TYPE | BYTES/ ELEMENT | UNCOMPRESSED SIZE | COMPRESSED SIZE | COMPRESSION RATIO |
|---|---|---|---|---|
| FP4 | 0.5 | 512 | 384 | 75% |
| INT4 | 0.5 | 512 | 384 | 75% |
| FP6 | 0.75 | 768 | 512 | 67% |
| FP8 | 1 | 1024 | 640 | 63% |
| INT8 | 1 | 1024 | 640 | 63% |
| FP16 | 2 | 2048 | 1152 | 56% |
| BF16 | 2 | 2048 | 1152 | 56% |

FIG. 10A

75% SPARSITY DATA TILE WITH 64 4X4 MATRICES

| DATA TYPE | BYTES/ ELEMENT | UNCOMPRESSED SIZE | COMPRESSED SIZE | COMPRESSION RATIO |
|---|---|---|---|---|
| FP4 | 0.5 | 512 | 256 | 50% |
| INT4 | 0.5 | 512 | 256 | 50% |
| FP6 | 0.75 | 768 | 320 | 42% |
| FP8 | 1 | 1024 | 384 | 38% |
| INT8 | 1 | 1024 | 384 | 38% |
| FP16 | 2 | 2048 | 640 | 31% |
| BF16 | 2 | 2048 | 640 | 31% |

FIG. 10B

SPARSITY STORAGE ARCHITECTURES FOR TRANSPOSABLE DATASETS

BACKGROUND

One aspect of data compression for computing systems includes processes that encode or restructure information to a compressed representation of a smaller size. The compressed representation uses fewer bits and less storage than the original representation, enabling more efficient data handling and transmission processes. The design of data compression techniques involves trade-offs among various factors, including space constraints and the degree of data distortion. For example, data compression techniques can be implemented as lossy or lossless compression. In lossless compression, no information is lost and can be retrieved during decompression. Lossy compression is generally more storage efficient but degrades the data.

SUMMARY

Techniques for manipulating sparsity storage architectures are provided. One aspect includes a computing device for implementing sparsity storage architectures, the computing device comprising processing circuitry and memory comprising instructions that, during execution, causes the processing circuitry to receive a dataset comprising data values; encode the received dataset by identifying a subset of the data values in the received dataset; and generating metadata describing indices of the subset of the data values in the received dataset; and store the encoded dataset comprising the metadata and packed data, wherein the packed data corresponds to the subset of the data values, and wherein the encoded dataset is capable of being decoded into a transposable data format with a same sparsity level in transposed and non-transposed forms.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 10A shows a table depicting compression ratios of different data types for an example fifty percent sparse data tile.

FIG. 10B shows a table depicting compression ratios of different data types for an example seventy-five percent sparse data tile.

DETAILED DESCRIPTION

Figure 1:
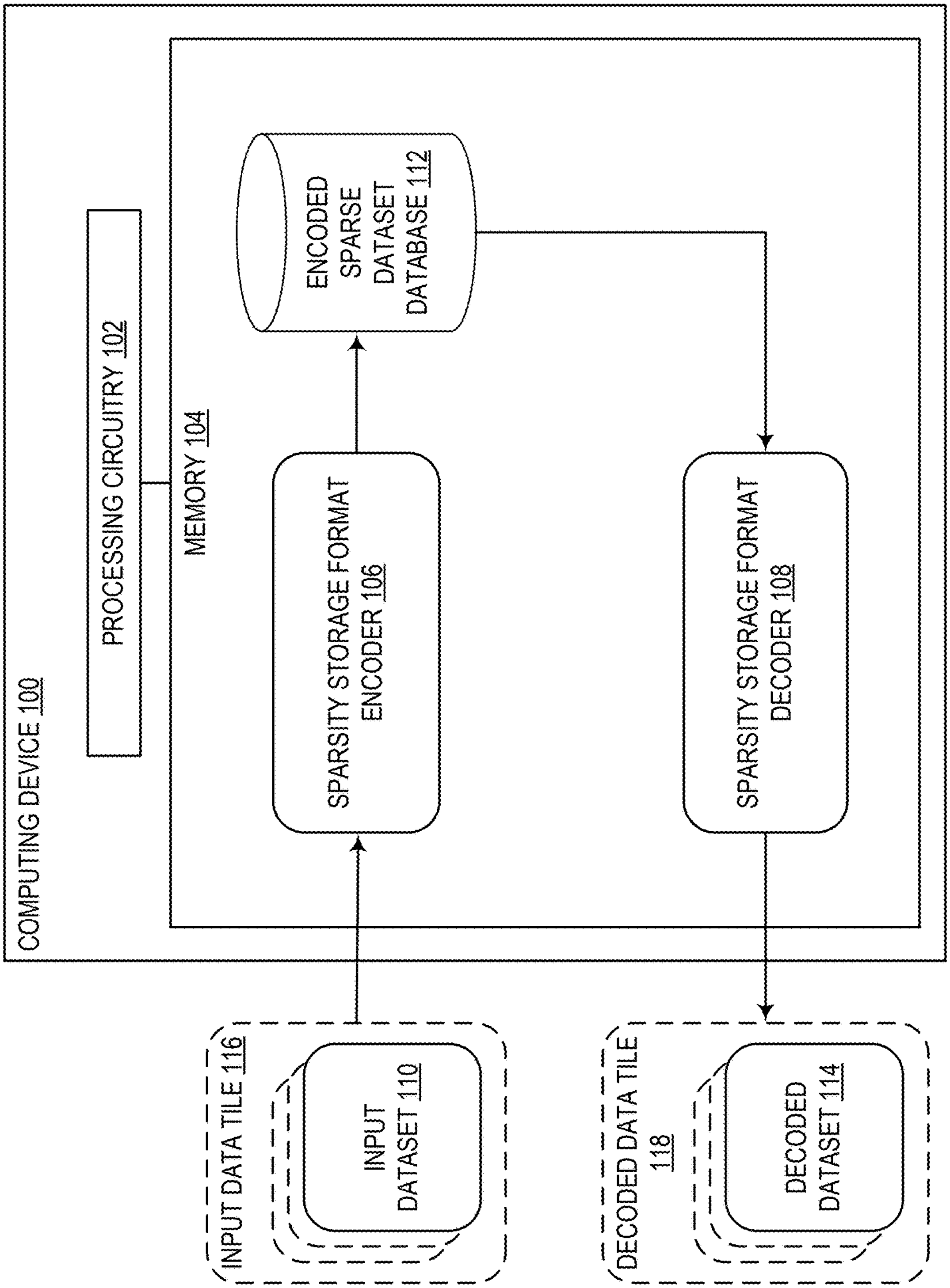
FIG. 1 shows a schematic view of an example computing device for manipulating sparsity storage formats.

Data compression techniques can be designed for efficiency in various aspects with regards to specific applications. For example, applications where data accuracy is a factor can employ the use of lossless compression techniques. Other applications may have a focus on storage and size efficiency. Some applications may have certain data pattern tendencies that can lead to compression techniques specialized for such applications. For example, certain applications may involve data with values that are highly repeated. Compression techniques can be designed to anticipate such patterns to provide more efficient encoding. In the area of machine learning models, especially larger models such as large language models, iterative training of the models can involve billions or trillions of parameters that can lead to large memory size and bandwidth requirements. However, these parameters often contain a large number of zeros and/or low, non-significant numerical values. As such, data compression techniques for such applications can consider the frequency of such values occurring.

In view of the observations above, examples of sparsity storage format architectures and associated encoding and decoding techniques are provided. In the example application of training parameters for large machine learning models, the parameters are often organized and utilized as tensors, a data container format. Compression techniques for reducing the size and operational bandwidth of the tensors can be advantageous in such applications. In some implementations, a sparsity storage format is utilized to implement sparse tensors in which a predetermined percentage of the parameters is zero-valued (or valued). Alternatively or additionally, the sparsity storage format can include information describing a level of sparsity (e.g., describing the percentage of parameters that are to be zero-valued (or valued)). Rather than store and transmit every parameter in a tensor, the tensor can be stored in the sparsity storage format with metadata that indicates which values of the tensor are zero and which are non-zero. The sparsity storage format can further include the non-zero data, which, when used in combination with the metadata, enables decoding and reconstruction of the tensor (or an acceptable approximation of the tensor in cases where parameter(s) are set to zero to meet the sparsity percentage defined by the format). Such a storage format can result in reduced memory size and bandwidth requirements compared to manipulating the tensors in their entireties since the metadata can be formatted with smaller storage requirements than the zero-valued data for many applications.

Briefly, sparsity storage formats and architectures can be implemented in various ways. In the example described above, tensors utilized for training parameters of large machine learning models are often utilized in a matrix format. Additionally, such applications can also involve performing transpose operations on the matrices containing the parameters. In view of these observations, encoding/decoding processes for a sparsity storage solution can be implemented for transposable matrices of data values. The encoding/decoding processes can be implemented as reciprocal parts—(1) an encoding process for converting a dense matrix into a sparse matrix for storage and transfer and (2) a decoding process for converting a sparse matrix into a dense matrix for computation and/or other applications. As described herein, a dense matrix can refer to an unencoded or a decoded matrix of data values, and a sparse matrix can refer to the encoded representation of the matrix.

In some implementations, the sparsity storage format is defined as a data structure containing (1) metadata describing indices of a subset of the data values in the matrix indicated to be data values to be passed through the encoding process (i.e., retain their values through the encoding/decoding process) and (2) packed data elements corresponding to the subset of data values in the matrix. Alternatively, the metadata can describe a subset of the data values in the matrix that is to be encoded, and the packed data elements represent the remaining data values that are to be passed through the encoding process. Together, the packed data elements and the metadata provide information to decode and reconstruct a dense matrix of data values similar to the original matrix, or an approximation thereof. As described in the present disclosure, metadata describing a subset of the data values of the original dataset will inherently also describe the remaining data values of the original dataset. For example, metadata describing a subset of the data values of the original dataset using a bitmap to indicate their indices with a '1' value will also inherently describe indices of the remaining data values in the dataset to be encoded/decoded using a '0' value.

The sparsity storage format can also define a sparsity level, which indicates how many data values (or percentage of data values) are to be encoded. For example, a fifty percent sparse storage format has fifty percent of the data values encoded. Alternatively, the sparsity storage format can define a sparsity level indicating how many data values (or percentage of data values) are to retain their values through the encoding/decoding process. Sparsity storage formats can be defined with any sparsity level, which is generally a fraction of the total number of data values in the matrix to be encoded.

For many applications, the metadata utilizes less storage space than the data values that it describes. In some implementations, the metadata describes data values designated to retain their values through the encoding/decoding process. In other implementations, the metadata describes data values designated to have a common value in the decompressed and decoded matrix. For example, the metadata can describe data values that are zero-valued (or are to be set to zero if they are not zero in the original matrix). The larger the percentage of data values in the dataset (up to the sparsity level) that matches the designated common value, the less data degradation will occur during the encoding/decoding process. Any value(s) can be designated as the common value(s) to be encoded in the metadata (e.g., a zero value, a null value, a one value, a set of values, etc.), the choice of which can depend on the application.

In cases where a set of values is designated as the common values, the encoding/decoding scheme is no longer lossless. In such cases, a predetermined value is inserted in accordance with the metadata, which indicates indices of the common values. Generally, the predetermined value is selected from the set of values designated as the common values. For example, in some implementations, the representations of −0 and +0 in floating point format are designated as the common values. During the decoding process, a representation of +0 in floating point format can be inserted in indices where the common values (−0 and +0) occurred in the original matrix.

The metadata can be implemented in various ways that logically describe indices of a subset of the data values in the matrix. For example, the metadata can be a bitmap containing a number of bits equal to the number of data values in the matrix, and a flipped bit indicates that the indexed data value is in the identified subset of the data values. Alternatively, the sparsity storage format can be defined such that a non-flipped bit indicates that the indexed data value is in the identified subset of the data values. Similarly, the subset of the data values can either represent data values that are retained through the encoding/decoding process or data values that are to be set to a common value after the decoding process. Depending on the data structure of the data values of the matrix, different storage efficiencies can be achieved. For example, metadata implemented as a bitmap utilizes a byte of storage for every eight data values. Depending on the data type of the data value that each bit represents, different storage efficiencies can be achieved by storing the metadata rather than the data values themselves. The metadata can also be implemented using other data structures. At a certain level of sparsity, it can be more efficient to store the metadata information as a list of numeric values (instead of a bitmap). For example, with a sixteen-element dataset and a sparsity level of 87.5% (i.e., fourteen out of the sixteen data values are to be set to a common value), the metadata can be implemented to describe two indices (the indices of the data values that are to be retained after encoding/decoding) using a 4-bit numerical format, for a total storage usage of eight bits (compared to a 16-bit bitmap needed to describe the sixteen data values).

Turning now to the drawings, sparsity storage architectures and associated encoding and decoding techniques are described in further detail. FIG. 1 shows a schematic view of an example computing device 100 for implementing sparsity storage formats. The computing device 100 includes processing circuitry 102 and memory 104 containing instructions that, during execution, cause the processing circuitry to perform the processes described herein. The computing device 100 can be implemented using various types of computing devices and components, including but not limited to personal computers, server computers, central processing units, and graphics processing units.

Given a defined sparsity storage format, encoding and decoding processes can be designed accordingly to implement the desired sparsity storage solution. A sparsity storage format can be defined in various ways. In some implementations, sparsity as a storage format is a compressed representation of a dataset containing a plurality of data values. In further implementations, the dataset is a transposable matrix containing a plurality of data values. The compressed representation, which can also be referred to as a sparsity block, is implemented to include at least two components that can be used to reconstruct the original dataset, or an approximation thereof. The first component includes sparsity metadata that describes indices of a subset of the data values in the dataset. In some implementations, data values at these indices are to retain their value when encoded/decoded, and data values at the remaining indices will have a common value when decoded. Data values at the remaining indices may or may not correspond to their original values. For example, a sparsity storage format can be defined such that when the sparsity block is decoded, the decoded dataset is generated with retained data values in indices described in the metadata, and the remaining indices are set to values of zero. Such an encoding process provides advantages when the expected dataset to be encoded contains a large number of data values having a common value. The second component of the sparsity block includes packed data elements that correspond to the subset of the data values in the indices described by the metadata. Together, the packed data elements and the metadata enable a reconstruction of the unencoded dataset or an approximate reconstruction of the unencoded dataset (depending on how many data values in the unencoded dataset have the designated common value). Designation of a data value that is to be a common value in the decoded dataset does not indicate that said data value have the same value as the designated common value in the original dataset. For example, the original dataset may contain less data values having the designated common value than a sparsity percentage level defined in the sparsity storage format. In such cases, the encoding may be lossy. Also, designation of a data value that is to be retained through the encoding/decoding process does not indicate that said data value does not have the same value as the designated common value in the original dataset. For example, the original dataset may contain more data values having the designated common value than a sparsity percentage level defined in the sparsity storage format. In such cases, a data value having the common value can be included in the subset of the data values described in the metadata and can be stored as a data element in the encoded dataset. In other words, the decoded dataset will have at least a minimum, and possibly more, of the sparsity percentage of the common value (e.g., given a designated common value of zero, a fifty percent sparsity storage format results in at least fifty percent of the data values in the decoded dataset to be zero-valued).

The computing device 100 includes a sparsity storage format encoder 106 and a sparsity storage format decoder 108 for performing encoding and decoding processes, respectively, for a defined sparsity storage format. The sparsity storage format encoder 106 can be implemented to perform encoding processes in various ways. In the depicted example, the encoding process starts with the sparsity storage format encoder 106 receiving an input dataset 110. The input dataset 110 can be received in various ways. For example, the input dataset 110 may be provided by an external device. In some implementations, the input dataset 110 is loaded from local memory 104 of the computing device 100. The input dataset 110 can be a dataset of a given format depending on the defined sparsity storage format being implemented. In some implementations, the sparsity storage format is designed for encoding and storing matrix datasets containing rows and columns of data values. The data values can be of any data type format, including numerical formats such as integer and floating-point representations. The dimensions of the matrix datasets can also depend on how the sparsity storage format being implemented is defined. In some implementations, the sparsity storage format is defined to store a compressed representation of a four-by-four matrix of data values. Other dimensions can also be implemented, including square and non-square matrix dimensions. In some implementations, the input dataset is non-square, and padding (e.g., zero padding) is added to form a square matrix.

In some implementations, the sparsity storage format encoder 106 performs an encoding process that includes identifying a subset of the data values of the input dataset 110 that is to retain their values through the encoding/decoding process. The process can include selecting a percentage of the data values based on the sparsity level defined in the sparsity storage format. The remaining data values can be designated to have a common value when decoded. The reverse can also be performed, where the data values that are to have a common value when decoded are first determined based on the complementary percentage. The remaining data values can then be designated as the identified subset of the data values. The sparsity percentage can be specified and defined by the sparsity storage format being implemented and is typically a fraction of the data values of the input dataset 110. In some implementations, the sparsity storage format is defined as a fifty percent sparse storage format where fifty percent of the data values of the dataset are designated to have a common value. Any level of sparsity can be implemented.

The subset of the data values can be identified in various ways. For example, data values matching the designated common value may be selected up to the sparsity percentage defined by the sparsity storage format. In some implementations, the encoder scans the matrix, individually comparing each data value of the matrix to see if they match the designated common value and ignoring the data otherwise. Once the sparsity percentage is reached, the scanning process may stop. The remaining data values are then selected to be in the identified subset of the data values. The remaining data values that would have matched the designated common value can be treated as non-matching data elements and can be stored as data element(s) in the encoded dataset. If the sparsity percentage is not reached, data values may be selected from the remaining data values until the sparsity percentage is reached. These selected values will be set to the common value in the decoded dataset, resulting in data degradation. These remaining data values can be selected in various ways. For example, in implementations where the common value is zero, the lowest remaining values can be selected until the sparsity percentage is reached.

Defining the sparsity percentage of data values having a common value can have trade-offs in storage efficiency and data degradation. In cases where the dataset to be encoded contains more than the sparsity percentage of data values having the designated common value, compression inefficiency can occur—e.g., the data could have been further compressed by defining a higher sparsity percentage of data values having a common value. In cases where the dataset to be encoded contains less than the sparsity percentage of data values with the designated common value, a remaining number of data values to reach the sparsity percentage in the dataset can be selected to enforce the definition of the sparse storage format. These data values are to be set to the designated common value during the decoding process and can result in data degradation. In some implementations, the remaining number of data values selected to reach the sparsity percentage are selected based on a predetermined criterion, such as based on similarity to the designated common value. For example, if the designated common value is zero, the lowest data values in the original dataset can be selected for encoding, up to the sparsity percentage.

Different applications may implement sparsity storage format definitions with different sparsity percentages of a common value. For example, certain applications may involve datasets with high occurrences of a given value. The sparsity storage format can be defined with a sparsity percentage corresponding to the anticipated occurrences of the given value. A higher sparsity percentage enables a higher efficiency of data compression. However, a sparsity percentage that is higher than the actual occurrences of the common value in the original dataset may result in inaccurate decoded datasets that are too degraded to be used.

After the subset of the data values of the input dataset 110 are identified, metadata describing indices of the subset of the data values in the input dataset 110 is generated. Data elements corresponding to the subset of the data values are combined with the generated metadata to form an encoded dataset representation of the input dataset 110. As described above, metadata describing the subset of the data values can be implemented to equivalently describe the remaining data values (i.e., given a set of elements, knowledge of a subset provides knowledge of elements not in the subset). As described herein, the encoded dataset representation may be referred to as a sparsity block. The encoded dataset is a sparse form that is compacted and contains data corresponding to the subset of the data values. The packed data elements corresponding to the subset of the data values can be logically organized in the encoded dataset such that the order of elements corresponds to their order in the matrix dataset. As the remaining data values are not included in the encoded dataset, storing and/or transferring the encoded dataset can be more efficient compared to the original input dataset 110. In such cases, the difference in storage requirements of the input dataset 110 and the encoded dataset includes the difference in storage requirements of the generated metadata and the remaining data values not included in the identified subset.

As described in the present disclosure, identifying a subset is functionally equivalent to identifying the complementary subset that includes the remaining elements. As such, the processes described herein can be performed in a complementary manner. For example, the process can include identifying a subset of the data values that are to be encoded such that they are set to a designated common value during the decoding process. The remaining data values can then be used to generate the packed data elements.

In the depicted example of FIG. 1, the encoded dataset is stored locally within a sparse dataset database 112. The encoded dataset may be utilized in various ways depending on the application. In some implementations, the encoded dataset is transferred to an external device. In the depicted example, the computing device 100 includes a sparsity storage format decoder 108 for decoding the encoded dataset (or any other encoded dataset, including those received from an external source). The metadata in the encoded dataset can be used to partially fill out a matrix with the designated common value in the indices corresponding to the remaining data values not included in the identified subset. The remaining indices of the matrix can be filled using the packed data elements in logical order. For example, the first data element of the packed data elements can be used to fill out the first unfilled index of the matrix, the second data element can be used to fill out the second unfilled index, and so on. Alternatively, the packed data elements can first be used to partially fill out a matrix based on indices described in the metadata, and the remaining indices can then be filled with the designated common value. As the packed data elements are encoded and stored in a logical manner, the input dataset can be reconstructed. This results in a decoded dataset 114 that may be used for various operations, such as matrix multiplication and other matrix manipulation techniques. As another example, a matrix transpose operation can be performed in which the transposed matrix can also re-encoded (and re-decoded).

The encoding and decoding processes described above can be performed with or without data type conversion. For example, during a decoding process, the generated decoded matrix can be filled out with data values of a different data type than the data type stored in the encoded dataset. Furthermore, the encoding and decoding processes described above are discussed in reference to a single dataset. In some implementations, the encoding and/or decoding processes are performed on a data tile that contains a plurality of datasets. For example, an input data tile 116 containing multiple input datasets 110 can be encoded to form an encoded data tile, which can be decoded into a decoded data tile 118 containing a plurality of decoded datasets 114. The encoding/decoding processes for a data tile can include individually performing such processes on each of the datasets that make up the data tile. The input data tile 116 can be of any dimension, including square and non-square matrices. In some implementations, the input data tile 116 is a non-square matrix, and padding is added to form a square matrix. In further implementations, padding is added such that the input data tile 116 can be partitioned into a plurality of square datasets. Data tiles are described and discussed in further detail with respect to FIGS. 7 and 8.

Figure 2:
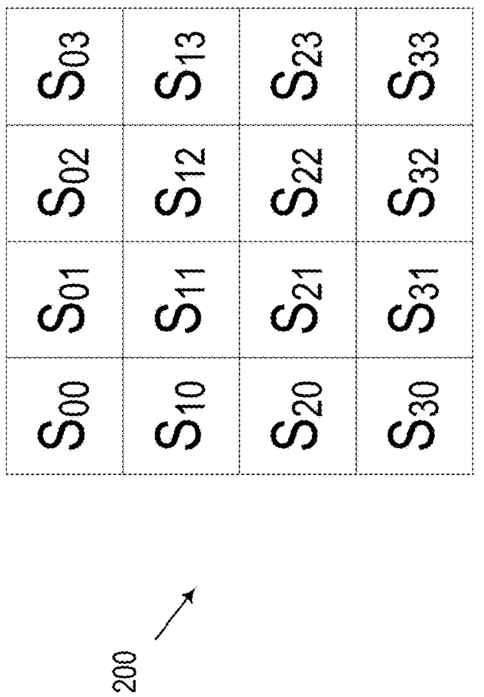
FIG. 2 shows a graphical representation of an example four-by-four matrix of data values, which can be manipulated using the computing device of FIG. 1.

FIG. 2 shows a graphical representation of an example four-by-four matrix 200 of data values. The matrix 200 illustrated can, for example, be the input dataset 110 or the decoded dataset 114 of FIG. 1. Matrix datasets can be implemented in sparsity storage formats to enable encoding and decoding of transposable datasets, which can be advantageous in various applications including but not limited to manipulation of training parameters in large machine learning models. In the depicted example, the matrix 200 is a four-by-four matrix containing sixteen data values $S_{RC}$, where R is the row index and C is the column index. Matrices with other dimensions may also be utilized depending on how the sparsity storage format being implemented is defined. In some implementations, the sparsity storage format defines a square matrix. In other implementations, the sparsity storage format defines a non-square matrix. The data values $S_{RC}$ can be of any data type format, including but not limited to number formats such as integer and floating-point representation.

Figure 3:
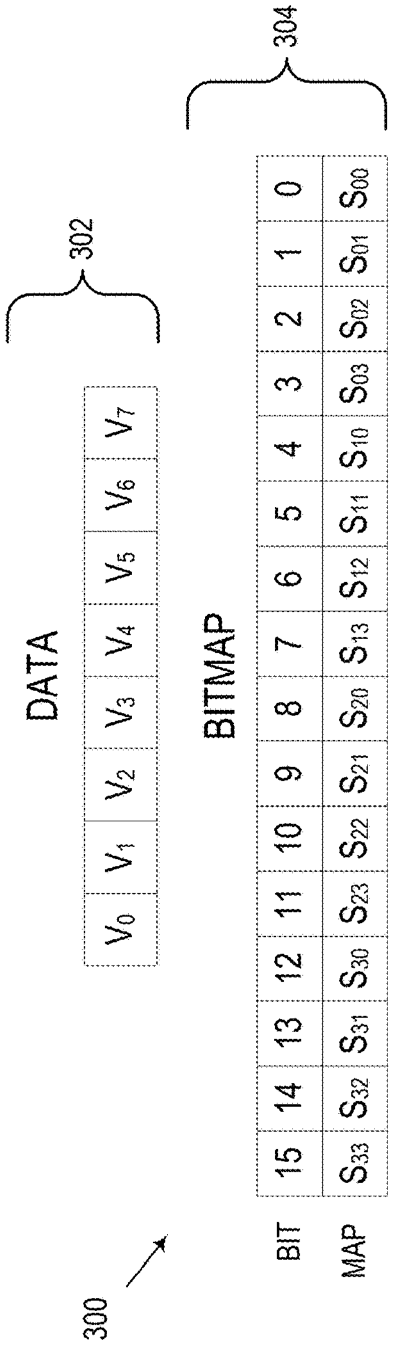
FIG. 3 shows a graphical representation of an example encoded dataset for a fifty percent sparse storage format for a sixteen-element matrix of data values, which can be an encoded representation of the matrix of FIG. 2.

FIG. 3 shows a graphical representation of an example encoded dataset 300 for a fifty percent sparse storage format for a sixteen-element matrix of data values. The encoded dataset 300 can be an encoded representation of the matrix 200 of FIG. 2, for example. The encoded dataset 300 includes a packed data elements component 302 and a metadata component 304 describing indices of the unencoded matrix. As the storage format is defined to be fifty percent sparse for a sixteen-element matrix, the packed data element component 302 includes eight data elements $V_0$-$V_7$ corresponding to eight data values in the unencoded matrix.

In the depicted example of FIG. 3, the metadata component 304 is implemented using a bitmap with sixteen bits, each bit position corresponding to a different index $S_{RC}$ in the unencoded matrix. The bitmap is logically organized such that the most significant bit (bit 15) corresponds to the bottom rightmost index ($S_{33}$) in the matrix, and the least significant bit (bit 0) corresponds to the top leftmost index ($S_{00}$) in the matrix. The intermediate bits correspond to the indices in the matrix row-by-row. The bitmap may be implemented in other ways. For example, the intermediate bits may correspond to the indices in the matrix column-by-column. In some implementations, the bits and corresponding indices are implemented in reverse, with the most significant bit corresponding to the top leftmost index. The bitmap may be designed to indicate indices of the identified subset of the data values by setting the corresponding bit(s) to '1'—i.e., a '1' bit indicates that the data value in the index corresponding to the bit position is determined to retain their values through the encoding/decoding process (using the packed data element component 302). In such cases, a '0' bit indicates that the data value in the index corresponding to the bit position is determined to have the designated common value in the decoded matrix. In other implementations, the reverse is implemented. Any of the schemes above, in any combination, may be implemented, and the sparsity storage format can be defined accordingly.

In some implementations, the encoded dataset includes information, such as header data, that describes various characteristics of the encoded dataset, such as but not limited to sparsity level (sparsity percentage), matrix size, matrix dimensions, etc. In other implementations, the application program utilizing the encoded dataset is aware of such information, and, as such, including such information in the encoded dataset may be unnecessary.

Figure 4:
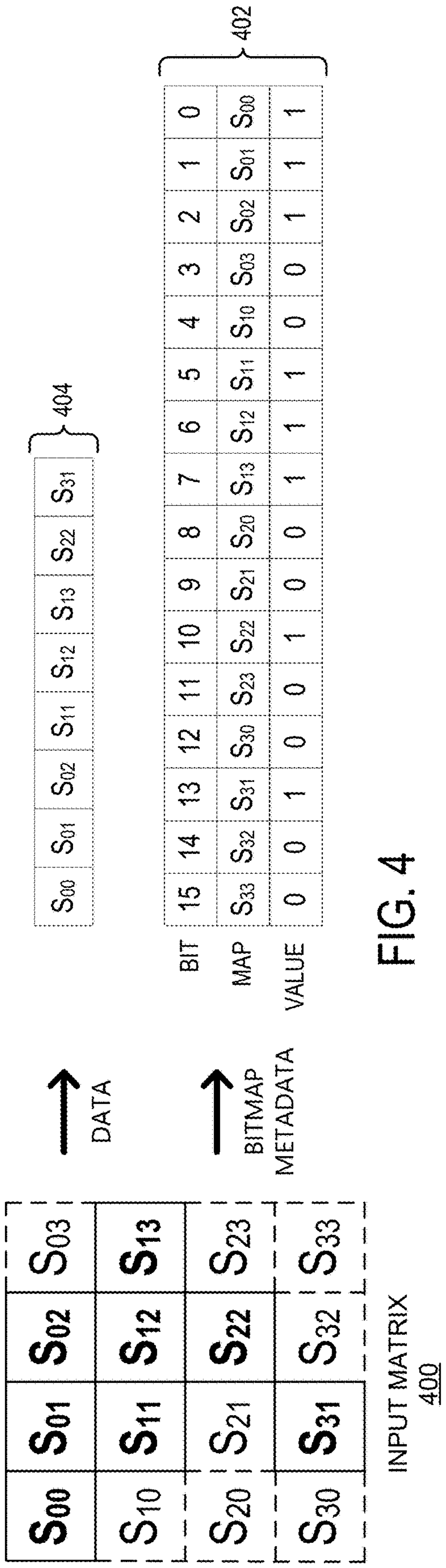
FIG. 4 shows a graphical representation of an example process for encoding a four-by-four matrix of data values using a fifty percent sparse storage format, which can be implemented using the computing device of FIG. 1.

FIG. 4 shows a graphical representation of an example process for encoding a four-by-four matrix 400 of data values using a fifty percent sparse storage format. The encoding process includes generating metadata, which, in the depicted example, includes a 16-bit bitmap 402. The bitmap 402 is designed to describe indices of an identified subset of the data values, indicated by positions of the '1' bits in the bitmap 402. Other schemes, including those described above, can be implemented. For example, the bitmap metadata can be implemented in reverse, where a '0' bit indicates a data value in the identified subset. Furthermore, the metadata can also be implemented using data structures other than a bitmap, including numerical representations of the indices of the identified subset of the data values. In some implementations, the metadata includes encoded data describing the indices of the identified subset of the data values, which can provide even higher storage efficiency. Any encoding methodology/algorithm can be utilized (e.g., arithmetic coding) and can include both lossy and lossless methods. In some implementations, an encoding method achieving the Shannon limit of information theory is utilized. Different encoding methodology can achieve different storage efficiency rates, which can depend on the sparsity level.

As the format is defined to be fifty percent sparse with a sixteen-element input matrix, the identified subset of the data values includes eight data values of the input matrix 400 that are to retain their values through the encoding/decoding process (indicated by solid lines). In the depicted example, data values $S_{00}$, $S_{01}$, $S_{02}$, $S_{11}$, $S_{12}$, $S_{13}$, $S_{22}$, and $S_{31}$ are in the identified subset of the data values. Accordingly, the bitmap 402 has the 13, 10, 7, 6, 5, 2, 1, and 0 bit positions set to '1'. The remaining data values not in the identified subset (indicated by dashed lines in the depicted input matrix 400) are to be encoded such that they will have a common value when decoded. In the depicted example, data values $S_{03}$, $S_{10}$, $S_{20}$, $S_{21}$, $S_{23}$, $S_{30}$, $S_{32}$, and $S_{33}$ are the remaining data values. Accordingly, the bitmap 402 has the 15, 14, 12, 11, 9, 8, 4, and 3 bit positions set to 0'. The encoding process further includes generating a second component that includes packed data elements 404 corresponding to the identified subset of the data values.

Figure 5:
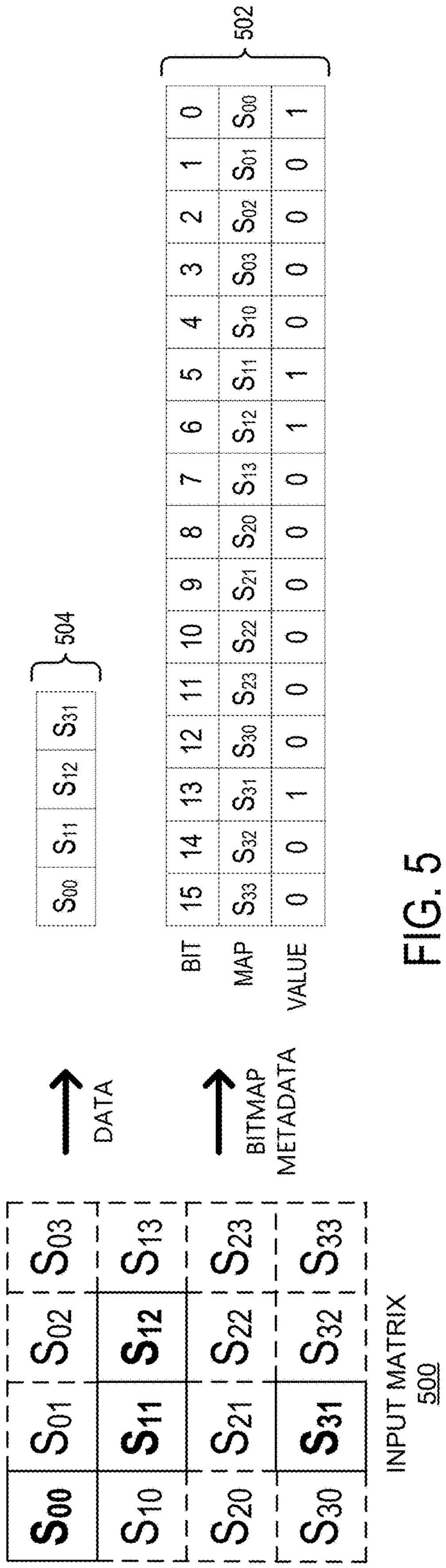
FIG. 5 shows a graphical representation of an example process for encoding a four-by-four matrix of data values using a seventy-five percent sparse storage format, which can be implemented using the computing device of FIG. 1.

FIG. 4 illustrates an encoding process for a specific sparsity storage format. Other formats may be implemented using similar logic. FIG. 5 shows a graphical representation of an example process for encoding a four-by-four matrix of data values using a seventy-five percent sparse storage format. In contrast with a fifty percent sparse storage format, a seventy-five percent sparse format has 75% of the data values of the input matrix 500 encoded such that they will have a common value when decoded, indicated in the resulting bitmap 502 with the corresponding bit positions having '0' values. Accordingly, the identified subset of the data values includes 25% of the data values of the input matrix 500, where their corresponding bit positions in the bitmap 502 are set to '1'. Furthermore, the encoding process includes generating packed data elements 504 that include the identified subset of the data values (data values $S_{00}$, $S_{11}$, $S_{12}$, and $S_{31}$ in the depicted example).

Figure 6:
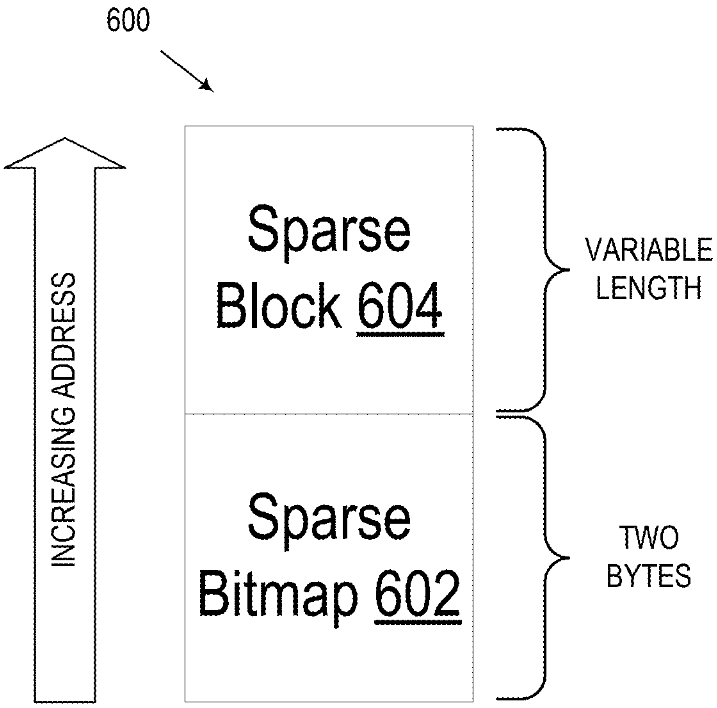
FIG. 6 shows an example storage layout of a sparsity storage format for a sixteen-element matrix of data values, which can be implemented using the computing device of FIG. 1.

FIG. 6 shows an example storage layout 600 of a sparsity storage format for a sixteen-element matrix of data values. In the depicted example, the encoded dataset includes a sparse bitmap 602 and a sparse data block 604, which can respectively correspond to the bitmap 402 and packed data elements 404 of FIG. 4, for example. The encoded dataset is stored in increasing memory address with the bitmap 602 preceding the data block 604. As the encoded dataset encodes a sixteen-element matrix, the bitmap 602 includes sixteen bits, or two bytes. The sparse data block 604 can be of variable length depending on how the sparsity storage format is defined. Different sparsity levels can result in different data lengths. For example, for a fifty percent sparse storage format for a sixteen-element matrix, the sparse data block 604 includes eight data values. The length of the sparse data block 604 would then be eight times the storage space for a data value of the matrix, which can depend on the data type format of the data values. For example, if the data type format is 8-bit floating point, the resulting data size of the encoded dataset for a fifty percent sparse storage format of a sixteen-element matrix can be ten bytes (eight bytes for the eight data elements and two bytes for the sparsity bitmap) instead of the sixteen bytes that the original dataset would require (sixteen bytes for the sixteen data elements). Larger data type formats can result in larger compression ratios.

In addition to encoding and decoding processes for a matrix dataset, such processes can also be implemented for data tiles. A data tile is a collection of matrix datasets organized in a predefined configuration. For example, a data tile can include a plurality of matrices organized such that the data tile is a transposable matrix. In some implementations, the data tile is a square matrix. In other implementations, the data tile is a non-square matrix. Such data structures enable a scalable implementation for sparse storage formats. For example, applications in large machine learning models can involve extremely large matrices with billions or trillions of data values. Implementing a sparse storage format for matrices of such sizes may be infeasible or inefficient. Instead, operations may be performed on smaller datasets that make up a larger dataset. For example, encoding and decoding processes for data tiles can be performed by individually encoding/decoding the matrix datasets that make up the data tile.

Figure 7:
FIG. 7 shows a graphical representation of an example data tile, which can be manipulated using the computing device of FIG. 1.

FIG. 7 shows a graphical representation of an example data tile 700. In the depicted example, the data tile 700 is an eight-by-eight grid containing sixty-four matrix datasets, or sparsity blocks $SB_{RC}$, where R is the row index and C is the column index. Each sparsity block can be implemented similarly. For example, each sparsity block $SB_{RC}$ can be implemented with a fifty percent sparse storage format for sixteen-element square matrices such that, when unencoded or decoded, the data tile is a thirty-two-by-thirty-two matrix of data values.

Figure 8:
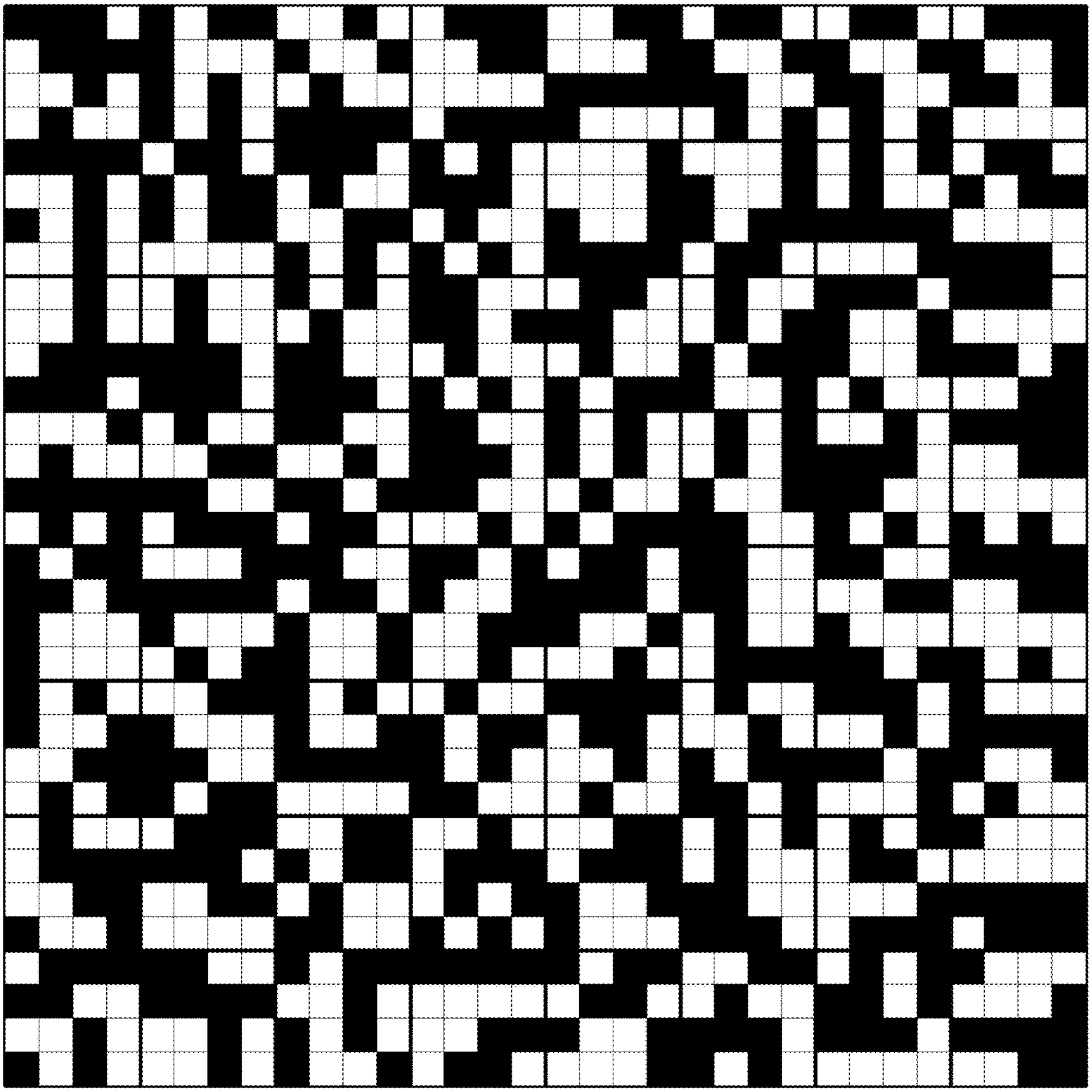
FIG. 8 shows a graphical representation of sparsity in an example data tile with a fifty percent sparse storage format, which can be the example data tile of FIG. 7.

FIG. 8 shows a graphical representation of sparsity in an example data tile 800 with a fifty percent sparse storage format. The example data tile 800 can be an expanded representation of the data tile 700 illustrated in FIG. 7. In the depicted example, the expanded data tile 800 includes sixty-four matrix datasets organized in an eight-by-eight grid. The resulting data tile 800 is a thirty-two-by-thirty-two transposable matrix of data values with fifty percent sparsity—e.g., fifty percent of the data values in each matrix dataset are indicated to have a designated common value, such as a zero value, resulting in the data tile having fifty percent sparsity. The graphical representation illustrated in FIG. 8 depicts two classifications of data values, where a black square indicates data value to be stored in the encoding and a white square indicates a data value determined to have a designated common value in the decoded representation.

Figure 9:
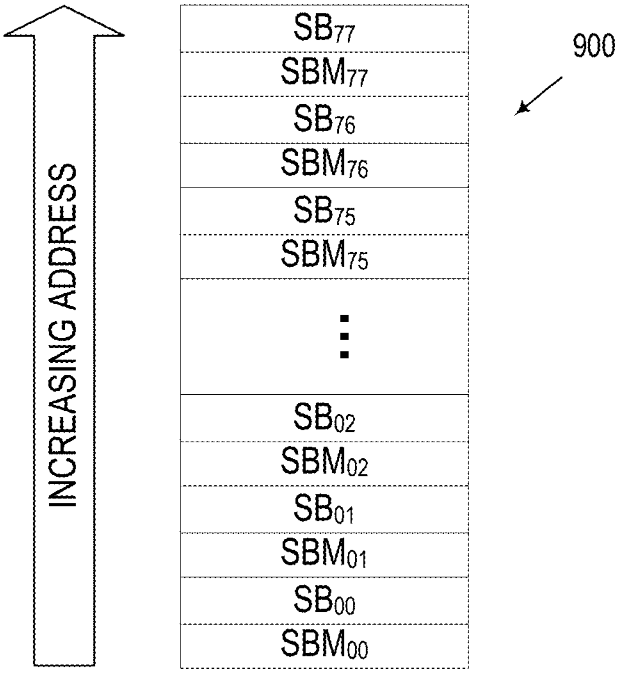
FIG. 9 shows an example storage layout of an encoded data tile, which can be implemented using the computing device of FIG. 1.

FIG. 9 shows an example storage layout 900 of an encoded data tile. A data tile can be stored by storing the matrix datasets that make up the data tile. In the depicted example, the matrix datasets that make up the data tile are stored in a consecutive block, with interleaved sparse bitmaps $SBM_{RC}$ and sparsity blocks $SB_{RC}$. For example, the storage layout 900, in increasing address, first include sparse bitmap $SBM_{00}$ and sparse block $SB_{00}$, then sparse bitmap $SBM_{01}$ and sparse block $SB_{01}$, and so on, ending with sparse bitmap $SBM_{77}$ and sparse block $SB_{77}$. Other storage layouts can also be implemented. For example, the logical order of the matrix datasets may be reversed, and the sparsity storage format may be defined accordingly. In some implementations, the storage layout 900 includes information, such as header data, describing characteristics of the data tile, such as but not limited to the data tile size, dimensions, matrix dataset configuration, and/or other characteristics of the data tile. In other implementations, such characteristics are known by the application program utilizing the encoded data tile, and storage of such information may be unnecessary.

FIG. 10A shows a table depicting compression ratios of different data types for an example fifty percent sparse data tile. The example data tile is formatted as an eight-by-eight grid of matrices. Each matrix contains four-by-four data values, resulting in a thirty-two-by-thirty-two grid of data values (similar to the data tile 800 illustrated in FIG. 8). The table illustrates different compression ratios depending on the data type. As shown, compression ratios for seven different data types are illustrated, including FP4, INT4, FP6, FP8, INT8, FP16, and BF16. As an example, the 4-bit floating point data type utilizes 0.5 byte for storing each element. The example data tile includes 1024 data values, which would result in an uncompressed storage size of 512 bytes for 4-bit floating point data values. After compression, the fifty percent sparse storage format removes half of the data values for storage during the encoding process. Along with the generated bitmap metadata (sixty-four bitmaps of two bytes each for the sixty-four matrices that make up the data tile), the resulting compressed size is 384 bytes, resulting in a compression ratio of seventy-five percent. For data tiles and matrix datasets of a given size, the compression ratio can be more efficient for larger sized data types since the size of the bitmap metadata stays constant. Different levels of sparsity also affect the compression ratio. FIG. 10B shows a table depicting compression ratios of different data types for an example seventy-five percent sparse data tile. As shown, under similar matrix dimensions, the compression ratio can be higher for various data types in comparison to a fifty percent sparsity data tile. Under certain sparsity levels, the metadata can be advantageously implemented using data structures other than a bitmap. For example, at higher levels of sparsity, including a list of indices of the identified subset of the data values can be more storage efficient (since there will be less data values in the identified subset at higher levels of sparsity).

Figure 11:
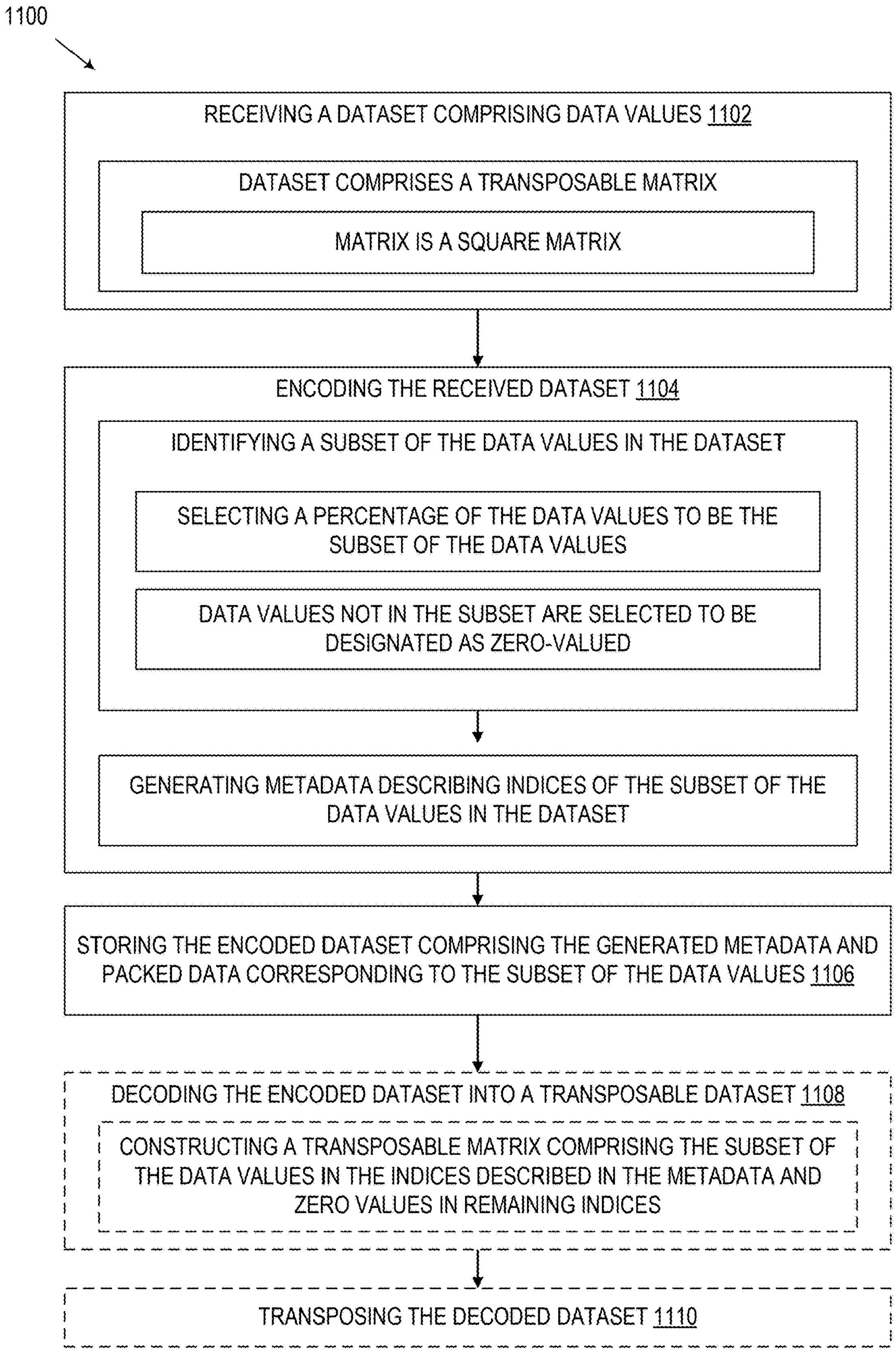
FIG. 11 shows a flow diagram of an example method for manipulating sparsity storage formats, which can be implemented using the computing device of FIG. 1.

FIG. 11 shows a flow diagram of an example method 1100 for manipulating sparsity storage formats. The method 1100 describes manipulation of a single matrix dataset (or sparsity block) but can be expanded to be performed on data tiles. For example, an input data tile can be partitioned into multiple sparsity blocks that are manipulated individually. In some implementations, the input data tile is non-square, and padding is added to form a square data tile that can be partitioned into a plurality of square datasets.

The method 1100 includes, at step 1102, receiving a dataset comprising data values. The dataset can be of various formats. In some implementations, the dataset is a transposable matrix. The matrix can be a square or a non-square matrix. In some implementations, the matrix is non-square, and padding is added to form a square matrix. Matrices of different sizes can be implemented. In some implementations, the dataset is a four-by-four matrix of data values. The data values can be of any data type format. The dataset can be received in various ways. For example, the dataset may be provided by an external device. In some implementations, the dataset is loaded from local memory.

The method 1100 includes, at step 1104, encoding the received dataset 1104. The dataset can be encoded in various ways. In some implementations, the encoding process includes identifying a subset of the data values of the received dataset. Indices of the data values not identified in the subset will be set to a designated common value in the decoded dataset. The common value can be designated using any value. In some implementations, the common value is a zero value. Determining the subset of the data values can be performed in various ways. In some implementations, a sparsity percentage is utilized to determine how many data values are in the subset of the data values. The sparsity percentage can define the sparsity level for the encoding process. In some implementations, a percentage of the dataset corresponding to the sparsity level is identified, and the remaining data values are identified to be in the subset of the data values.

Selection of the subset of the data values can be performed using various criteria. In some implementations, data values in the dataset are scanned and compared to see if they do not match the designated common value. If so, they are included in the subset of the data values. In some implementations, the data values of the dataset are scanned individually and compared to determine if they match the designated common value. If so, they are not included in the subset of the data values (up to the sparsity percentage). If matched data values are found up to the sparsity percentage before the entire dataset is scanned, the remaining data values (including the non-matched values) can be included in the subset of the data values. In such cases, data values having the designated common value may be included in the subset of the data values. If the sparsity percentage is not reached after the entire dataset is scanned, a remaining number of data values in the dataset can be selected to not be included in the subset of the data values, even if they do not match with the designated common value. Selection of the non-matching data values to not be included in the subset of the data values can be performed using any criteria, including random selection. In some implementations, the data values closest to the designated common value are selected to not be included in the subset of the data values. Conversely, data values not to be included in the subset of the data values can first be determined, and the remaining data values are selected to be the subset of the data values.

The method 1100 includes, at step 1106, storing the encoded dataset that includes the generated metadata and packed data corresponding to the subset of the data values. Various storage layouts can be implemented. For example, the metadata and the packed data can be stored in increasing address adjacent to one another. In some implementations, information describing the characteristics of the dataset, such as matrix dimensions, is stored. Sparsity level can also be stored. Such information can also be assumed by the software and application programs operating on the dataset. In such cases, information describing the characteristics of the dataset can be unnecessary.

The method 1100 optionally includes, at step 1108, decoding the encoded dataset into a transposable dataset. The decoding process can be performed in various ways. In some implementations, the decoding process includes constructing a transposable matrix that includes the subset of the data values in the indices described in the metadata corresponding to the subset of the data values and a common value in the remaining indices. Construction of the transposable matrix can be performed in various ways. The metadata in the encoded dataset can be used to partially fill out a matrix with the designated common value in the indices not corresponding to the subset of the data values. The remaining indices of the matrix can be filled using the packed data corresponding to the subset of the data values. Alternatively, the matrix can be partially filled with the packed data using the indices described in the metadata corresponding to the subset of the data values, and the remaining indices can be filled with the designated common value.

The method 1100 optionally includes, at step 1110, transposing the decoded dataset. The transposed dataset retains the same sparsity level as the decoded dataset. In some implementations, the transposed dataset is re-encoded using the method 1100 as described in FIG. 11.

In some embodiments, the methods and processes described herein may be tied to a computing system of one or more computing devices. In particular, such methods and processes may be implemented as a computer-application program or service, an application-programming interface (API), a library, and/or other computer-program product.

Figure 12:
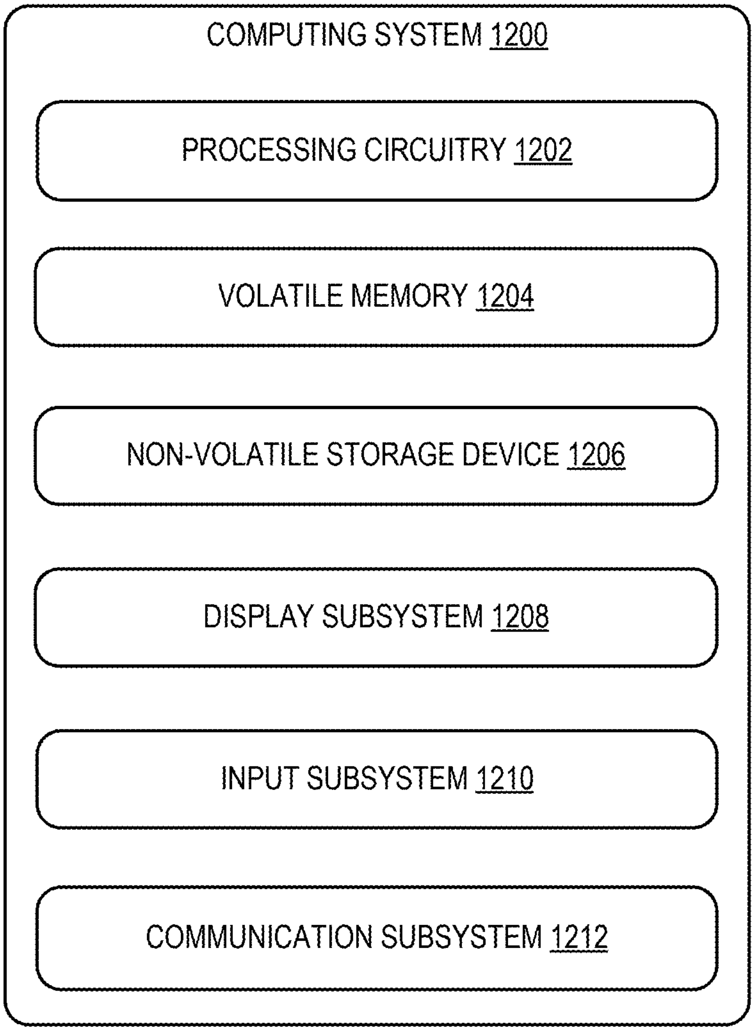
FIG. 12 shows a schematic view of an example computing environment in which the computer device of FIG. 1 may be enacted.

FIG. 12 schematically shows a non-limiting embodiment of a computing system 1200 that can enact one or more of the methods and processes described above. Computing system 1200 is shown in simplified form. Computing system 1200 may embody the computing device 100 described above and illustrated in FIG. 1, respectively. Components of computing system 1200 may be included in one or more personal computers, server computers, tablet computers, home-entertainment computers, network computing devices, video game devices, mobile computing devices, mobile communication devices (e.g., smartphone), and/or other computing devices, and wearable computing devices such as smart wristwatches and head mounted augmented reality devices.

Computing system 1200 includes processing circuitry 1202, volatile memory 1204, and a non-volatile storage device 1206. Computing system 1200 may optionally include a display subsystem 1208, input subsystem 1210, communication subsystem 1212, and/or other components not shown in FIG. 12.

Processing circuitry typically includes one or more logic processors, which are physical devices configured to execute instructions. For example, the logic processors may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors configured to execute software instructions. Additionally or alternatively, the logic processor may include one or more hardware logic circuits or firmware devices configured to execute hardware-implemented logic or firmware instructions. Processors of the processing circuitry 1202 may be single-core or multi-core, and the instructions executed thereon may be configured for sequential, parallel, and/or distributed processing. Individual components of the processing circuitry optionally may be distributed among two or more separate devices, which may be remotely located and/or configured for coordinated processing. For example, aspects of the computing system disclosed herein may be virtualized and executed by remotely accessible, networked computing devices configured in a cloud-computing configuration. In such a case, these virtualized aspects are run on different physical logic processors of various different machines, it will be understood. These different physical logic processors of the different machines will be understood to be collectively encompassed by processing circuitry 1202.

Non-volatile storage device 1206 includes one or more physical devices configured to hold instructions executable by the processing circuitry to implement the methods and processes described herein. When such methods and processes are implemented, the state of non-volatile storage device 1206 may be transformed—e.g., to hold different data.

Non-volatile storage device 1206 may include physical devices that are removable and/or built in. Non-volatile storage device 1206 may include optical memory, semiconductor memory, and/or magnetic memory, or other mass storage device technology. Non-volatile storage device 1206 may include nonvolatile, dynamic, static, read/write, read-only, sequential-access, location-addressable, file-addressable, and/or content-addressable devices. It will be appreciated that non-volatile storage device 1206 is configured to hold instructions even when power is cut to the non-volatile storage device 1206.

Volatile memory 1204 may include physical devices that include random access memory. Volatile memory 1204 is typically utilized by processing circuitry 1202 to temporarily store information during processing of software instructions. It will be appreciated that volatile memory 1204 typically does not continue to store instructions when power is cut to the volatile memory 1204.

Aspects of processing circuitry 1202, volatile memory 1204, and non-volatile storage device 1206 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 1200 typically implemented in software by a processor to perform a particular function using portions of volatile memory, which function involves transformative processing that specially configures the processor to perform the function. Thus, a module, program, or engine may be instantiated via processing circuitry 1202 executing instructions held by non-volatile storage device 1206, using portions of volatile memory 1204. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 1208 may be used to present a visual representation of data held by non-volatile storage device 1206. The visual representation may take the form of a GUI. As the herein described methods and processes change the data held by the non-volatile storage device, and thus transform the state of the non-volatile storage device, the state of display subsystem 1208 may likewise be transformed to visually represent changes in the underlying data. Display subsystem 1208 may include one or more display devices utilizing virtually any type of technology. Such display devices may be combined with processing circuitry 1202, volatile memory 1204, and/or non-volatile storage device 1206 in a shared enclosure, or such display devices may be peripheral display devices.

When included, input subsystem 1210 may comprise or interface with one or more user-input devices such as a keyboard, mouse, touch screen, camera, or microphone.

When included, communication subsystem 1212 may be configured to communicatively couple various computing devices described herein with each other, and with other devices. Communication subsystem 1212 may include wired and/or wireless communication devices compatible with one or more different communication protocols. As non-limiting examples, the communication subsystem may be configured for communication via a wired or wireless local- or wide-area network, broadband cellular network, etc. In some embodiments, the communication subsystem may allow computing system 1200 to send and/or receive messages to and/or from other devices via a network such as the Internet.

The following paragraphs provide additional description of the subject matter of the present disclosure. One aspect provides a computing device for implementing sparsity storage architectures, the computing device comprising: processing circuitry and memory comprising instructions that, during execution, cause the processing circuitry to: receive a dataset comprising data values; encode the received dataset by: identifying a subset of the data values in the received dataset; and generating metadata describing indices of the subset of the data values in the received dataset; and store the encoded dataset comprising the metadata and packed data, wherein the packed data corresponds to the subset of the data values, and wherein the encoded dataset is capable of being decoded into a transposable data format with a same sparsity level in transposed and non-transposed forms. In this aspect, additionally or alternatively, the instructions, during execution, further cause the processing circuitry to decode the encoded dataset into a transposable dataset that comprises: the packed data in indices of the transposable dataset corresponding to the indices of the subset of the data values in the received dataset; and zero-valued data values in remaining indices of the transposable dataset. In this aspect, additionally or alternatively, the instructions, during execution, further cause the processing circuitry to transpose the transposable dataset. In this aspect, additionally or alternatively, the instructions, during execution, further cause the processing circuitry to encode the transposed transposable dataset. In this aspect, additionally or alternatively, the transposable dataset is formatted as a square matrix. In this aspect, additionally or alternatively, the instructions, during execution, further cause the processing circuitry to store an encoded data tile comprising a plurality of encoded datasets that includes the stored encoded dataset. In this aspect, additionally or alternatively, the instructions, during execution, further cause the processing circuitry to decode the encoded data tile into a transposable decoded data tile comprising a plurality of transposable datasets, wherein the transposable decoded data tile is capable of being encoded in its transposed form. In this aspect, additionally or alternatively, the encoded data tile is stored such that the encoded datasets are stored with interleaving packed data and metadata. In this aspect, additionally or alternatively, the encoded data tile is stored such that packed data of the encoded datasets are stored together in a first location, and the metadata of the encoded datasets are stored together in a second location. In this aspect, additionally or alternatively, the metadata comprises one or more of a list of indices of the subset of the data values, an encoded form of a list of indices of the subset of the data values, or a bitmap, wherein each bit in the bitmap corresponds to an index of a data value of the received dataset.

Another aspect provides a method for implementing sparsity storage architectures, the method comprising: receiving a dataset comprising data values; encoding the received dataset by: identifying a subset of the data values in the received dataset; and generating metadata describing indices of the subset of the data values in the received dataset; and storing the encoded dataset comprising the metadata and packed data, wherein the packed data corresponds to the subset of the data values, and wherein the encoded dataset is capable of being decoded into a transposable data format with a same sparsity level in transposed and non-transposed forms. In this aspect, additionally or alternatively, the method further comprises decoding the encoded dataset into a transposable dataset that comprises: the packed data in indices of the transposable dataset corresponding to the indices of the subset of the data values in the received dataset; and zero-valued data values in remaining indices of the transposable dataset. In this aspect, additionally or alternatively, the method further comprises transposing the transposable dataset. In this aspect, additionally or alternatively, the transposable dataset is formatted as a square matrix. In this aspect, additionally or alternatively, the method further comprises storing an encoded data tile comprising a plurality of encoded datasets that includes the stored encoded dataset. In this aspect, additionally or alternatively, the method further comprises decoding the encoded data tile into a transposable decoded data tile comprising a plurality of transposable datasets, wherein the transposable decoded data tile is capable of being encoded in its transposed form. In this aspect, additionally or alternatively, the encoded data tile is stored such that the encoded datasets are stored with interleaving packed data and metadata. In this aspect, additionally or alternatively, the encoded data tile is stored such that packed data of the encoded datasets are stored together in a first location, and the metadata of the encoded datasets are stored together in a second location. In this aspect, additionally or alternatively, the metadata comprises one or more of a list of indices of the subset of the data values, an encoded form of a list of indices of the subset of the data values, or a bitmap, wherein each bit in the bitmap corresponds to an index of a data value of the received dataset.

Another aspect provides a computing device for implementing sparsity storage architectures, the computing device comprising: processing circuitry and memory comprising instructions that, during execution, cause the processing circuitry to: receive an encoded dataset that includes a block of data values and metadata describing a set of indices to be set to data values of the block of data values; and decode the encoded dataset into a transposable matrix by: for each index of the set of indices, inserting a data value from the block of data values into the index of the transposable matrix; and inserting a common value to remaining indices of the transposable matrix that were not inserted with a data value from the block of data values.

"And/or" as used herein is defined as the inclusive or $\vee$, as specified by the following truth table:

| A | B | A $\vee$ B |
|---|---|---|
| True | True | True |
| True | False | True |
| False | True | True |
| False | False | False |

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A computing device for implementing sparsity storage architectures, the computing device comprising:

processing circuitry and memory comprising instructions that, during execution, cause the processing circuitry to:

receive a data tile organized in a transposable data format and comprising a plurality of datasets, each dataset comprising data values, and each dataset organized in the transposable data format;

encode the data tile, wherein to encode the data tile comprises:

encode each dataset of the plurality of datasets by:

selecting a subset of the data values in a respective received dataset to achieve a sparsity percentage defined by a sparsity storage format; and generating metadata describing indices of the subset of the data values in the respective dataset; and store the encoded data tile dataset comprising the metadata and packed data of each encoded dataset, wherein:

the packed data corresponds to the subset of the data values, each encoded dataset is capable of being decoded into the transposable data format with a same sparsity level in transposed and non-transposed forms, and the encoded data tile is capable of being decoded into the transposable data format with the same sparsity level in the transposed and the non-transposed forms.

2. The computing device of claim 1, wherein the instructions, during execution, further cause the processing circuitry to:

decode an encoded dataset of the plurality of datasets into a transposable dataset that comprises:

the packed data of the encoded dataset in indices of the transposable dataset corresponding to the indices of the subset of the data values in the encoded dataset; and zero-valued data values in remaining indices of the transposable dataset.

3. The computing device of claim 2, wherein the instructions, during execution, further cause the processing circuitry to:

transpose the transposable dataset.

4. The computing device of claim 3, wherein the instructions, during execution, further cause the processing circuitry to:

encode the transposed transposable dataset.

5. The computing device of claim 2, wherein the transposable dataset is formatted as a square matrix.

6. The computing device of claim 1, wherein the instructions to select the subset of the data values comprise instructions that, during execution, further cause the processing circuitry to:

select the subset of the data values based on the data values comprising a non-zero value until the sparsity percentage is achieved or no non-zero values remain in the respective dataset.

7. The computing device of claim 1, wherein the instructions, during execution, further cause the processing circuitry to:

decode the encoded data tile into a transposable decoded data tile comprising a plurality of transposable datasets, wherein the transposable decoded data tile is capable of being encoded in its transposed form.

8. The computing device of claim 1, wherein the encoded data tile is stored such that the encoded datasets are stored with interleaving packed data and metadata.

9. The computing device of claim 1, wherein the encoded data tile is stored such that packed data of the encoded datasets are stored together in a first location, and the metadata of the encoded datasets are stored together in a second location.

10. The computing device of claim 1, wherein the metadata comprises one or more of a list of indices of the subset of the data values, an encoded form of a list of indices of the subset of the data values, or a bitmap, wherein each bit in the bitmap corresponds to an index of a data value of the respective dataset.

11. A method for implementing sparsity storage architectures, the method comprising:

receiving a data tile organized in a transposable data format and comprising a plurality of datasets, each dataset comprising data values, and each dataset organized in the transposable data format;

encoding the data tile, wherein to encode the data tile comprises:

encoding each dataset of the plurality of datasets by:

selecting a subset of the data values in a respective dataset to achieve a sparsity percentage defined by a sparsity storage format; and generating metadata describing indices of the subset of the data values in the respective dataset; and storing the encoded data tile comprising the metadata and packed data of each encoded dataset, wherein;

the packed data corresponds to the subset of the data values, each encoded dataset is capable of being decoded into the transposable data format with a same sparsity level in transposed and non-transposed forms, and the encoded data tile is capable of being decoded into the transposable data format with the same sparsity level in the transposed and the non-transposed forms.

12. The method of claim 11, further comprising:

decoding an encoded dataset of the plurality of datasets into a transposable dataset that comprises:

the packed data of the encoded dataset in indices of the transposable dataset corresponding to the indices of the subset of the data values in the encoded dataset; and zero-valued data values in remaining indices of the transposable dataset.

13. The method of claim 12, further comprising:

transposing the transposable dataset.

14. The method of claim 12, wherein the transposable dataset is formatted as a square matrix.

15. The method of claim 11, wherein the selecting the subset of the data values comprises selecting the subset of the data values based on the data values comprising a non-zero value until the sparsity percentage is achieved or no non-zero values remain in the respective dataset.

16. The method of claim 11, further comprising:

decoding the encoded data tile into a transposable decoded data tile comprising a plurality of transposable datasets, wherein the transposable decoded data tile is capable of being encoded in its transposed form.

17. The method of claim 11, wherein the encoded data tile is stored such that the encoded datasets are stored with interleaving packed data and metadata.

18. The method of claim 11, wherein the encoded data tile is stored such that packed data of the encoded datasets are stored together in a first location, and the metadata of the encoded datasets are stored together in a second location.

19. The method of claim 11, wherein the metadata comprises one or more of a list of indices of the subset of the data values, an encoded form of a list of indices of the subset of the data values, or a bitmap, wherein each bit in the bitmap corresponds to an index of a data value of the respective dataset.

20. A computing device for implementing sparsity storage architectures, the computing device comprising:

processing circuitry and memory comprising instructions that, during execution, cause the processing circuitry to:

receive an encoded data tile comprising a plurality of encoded datasets, each encoded dataset comprising a block of data values and metadata describing a set of indices to be set to data values of the block of data values; and decode the encoded data tile, wherein to decode the encoded data tile comprises:

decode each encoded dataset of the plurality of encoded datasets into a transposable matrix by:

for each index of the set of indices, inserting a data value from the block of data values into the index of the transposable matrix; and inserting a common value to remaining indices of the transposable matrix that were not inserted with a data value from the block of data values.

* * * * *